United States Patent
Ho et al.

(10) Patent No.: US 7,883,386 B2
(45) Date of Patent: Feb. 8, 2011

(54) OLED PIXEL STRUCTURE AND METHOD FOR MANUFACTURING THE SAME

(75) Inventors: King-Yuan Ho, Chiayi County (TW); Po-Chu Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 647 days.

(21) Appl. No.: 11/480,887

(22) Filed: Jul. 6, 2006

(65) Prior Publication Data

US 2007/0236134 A1 Oct. 11, 2007

(30) Foreign Application Priority Data

Apr. 7, 2006 (TW) ................. 95112329 A

(51) Int. Cl.
H01L 51/40 (2006.01)
H01J 9/22 (2006.01)
H01L 51/00 (2006.01)

(52) U.S. Cl. .................. 445/24; 427/66; 313/504; 313/500

(58) Field of Classification Search ........... 313/504, 313/506; 445/24; 427/66; 345/60
See application file for complete search history.

(56) References Cited

U.S. PATENT DOCUMENTS

| | | | | |
|---|---|---|---|---|
| 2001/0015256 A1* | 8/2001 | Yamazaki et al. | ........... | 156/289 |
| 2004/0108978 A1* | 6/2004 | Matsueda et al. | ............. | 345/76 |
| 2004/0217694 A1* | 11/2004 | Cok et al. | ................... | 313/504 |
| 2005/0206307 A1* | 9/2005 | Park | ........................... | 313/504 |
| 2005/0270444 A1* | 12/2005 | Miller et al. | ................ | 349/108 |
| 2007/0063192 A1* | 3/2007 | Peng | ........................... | 257/40 |
| 2007/0123133 A1* | 5/2007 | Winters | ....................... | 445/24 |

* cited by examiner

Primary Examiner—Karabi Guharay
(74) Attorney, Agent, or Firm—Birch, Stewart, Kolasch & Birch, LLP

(57) ABSTRACT

An organic light emitting display (OLED) pixel structure and a method for manufacturing the same, which can be applied for improving the resolution of an OLED without significantly changing the current OLED manufacturing process. With a novel pixel arrangement and circuit layout, an organic light emitting material is evaporated onto a substrate through a mask and thus a plurality of sub-pixels are formed simultaneously while enabling each sub-pixel to correspond to different pixels. Thereby, the area of each sub-pixel is reduced and the resolution of a display is increased.

6 Claims, 11 Drawing Sheets

US 7,883,386 B2

OLED PIXEL STRUCTURE AND METHOD FOR MANUFACTURING THE SAME

BACKGROUND OF THE INVENTION

1. Field of the Invention

The present invention generally relates to an organic light emitting display (OLED) pixel structure and a method for manufacturing the same and, more particularly, to an OLED pixel structure and a method for manufacturing the OLED pixel structure using a novel pixel arrangement so as to improve the resolution of an OLED panel.

2. Description of the Prior Art

In OLED manufacturing, full color displays implemented using red (R), green (G) and blue (B) organic electro-luminescent (EL) materials exhibit high brightness, high contrast, high color saturation but suffer from limited resolution because the opening areas on the shadow mask for EL material evaporation can not be effectively reduced.

Please refer to FIG. 1, which is a schematic diagram showing an evaporation process for an organic EL material. In mass production, the current EL evaporation process uses a single EL source in a vacuum chamber. As shown in FIG. 1, a shadow mask 10 is disposed between a substrate 12 and an EL source 14, wherein the surface of the substrate 12 to be deposited thereon faces downwards to the EL source 14. When the EL source 14 is heated up, the organic EL material is evaporated through a plurality of openings 102 in the shadow mask 10 onto a plurality of deposited regions 122 on the substrate 12. By shifting the shadow mask 10 and the substrate 12, the EL source 14 evaporates the organic EL material for one of the three colors onto the pre-determined deposited regions 122 and then evaporates the organic EL materials for each of the other two colors. Finally, the organic EL materials for R, G and B are formed on the deposited regions 122 on the substrate 12, wherein each of the deposited regions 122 corresponds to a sub-pixel.

Please refer to FIG. 2, which is a schematic circuit diagram showing equivalent pixel circuits and driver circuits of an OLED panel. The OLED panel 20, using two thin-film transistors (TFT's) for example, comprises data lines D1, D2, ..., Dm and scanning lines G1, G2, ..., Gn. Each data line and an intersecting scanning line are used to control a display unit 21. For example, a switching transistor $T_{S11}$ comprises the gate coupled to a scanning line G1 and the source coupled to a data line D1 for storage and addressing of an image data. A driving transistor $T_{D11}$ comprises the gate coupled to the drain of the $T_{S11}$ and the source coupled to a voltage source $V_{DD}$ for controlling the driving current according to the storage capacitor $C_{S11}$. One end of the storage capacitor $C_{S11}$ is coupled to the drain of the $T_{S11}$ while the other end is coupled to a reference voltage VL. The anode of the OLED is coupled the drain of the $T_{D11}$ and the cathode is coupled to the ground GND.

The schematic circuit diagram of FIG. 2 comprises the switching transistors $T_{S11}$~$T_{S1m}$, $T_{S21}$~$T_{S2m}$, ..., $T_{Sn1}$~$T_{Snm}$, the driving transistors $T_{D11}$~$T_{D1m}$, $T_{D21}$~$T_{D2m}$, ..., $T_{Dn1}$~$T_{Dnm}$, the storage capacitors $C_{S11}$~$C_{S1m}$, $C_{S21}$~$C_{S2m}$, ..., $S_{Sn1}$~$C_{Snm}$, and the OLED's. Each display unit 21 corresponds to a sub-pixel. A pixel comprises three sub-pixels for R, G and B corresponding to three display units. In other words, in FIG. 1, when the organic EL material is evaporated through the plurality of openings 102 in the shadow mask 10 onto the plurality of deposited regions 122 on the substrate 12, the area of one of the openings 102 corresponds to the area of a sub-pixel. Each sub-pixel corresponds to two TFT's and one storage capacitor.

Please refer to FIG. 3A and FIG. 3B, which are schematic diagrams showing pixel arrangements of an OLED panel. In FIG. 3A, there are a plurality of pixels 31 comprising a red sub-pixel 312, a green sub-pixel 314 and a blue sub-pixel 316 on an OLED panel 30. Each sub-pixel corresponds to two TFT's and one storage capacitor as shown in FIG. 2. Moreover, sub-pixels with different colors have different lifetimes. The sub-pixel with the shortest life-time limits the durability of whole display panel. If the red sub-pixel and the blue sub-pixel, which exhibit lower brightness, are designed to have larger areas, the driving currents for the red sub-pixel and the blue sub-pixel could be lowered so as to enhance the durability of whole display panel. In FIG. 3B, there is a white (W) sub-pixel 368 in addition to a red sub-pixel 362, a green sub-pixel 364 and a blue sub-pixel 366 in each of the pixels 36 on the OLED panel 35. The red sub-pixel 362, the green sub-pixel 364, the blue sub-pixel 366 and the white sub-pixel 368 may have different areas. Since each of the sub-pixels corresponds to two TFT's and one storage capacitor as shown in FIG. 2 and the area of each of the sub-pixels is determined by the opening 102 of the shadow mask 10. In other words, the sub-pixel area formed by evaporating an organic EL material through the opening 102 of the shadow mask 10 onto the deposited region 122 can not be unlimitedly reduced. Therefore, the resolution of the OLED panel is limited by the evaporation process.

Therefore, there exists a need in providing an OLED pixel structure and a method for manufacturing the OLED pixel structure using a novel pixel arrangement so as to improve the resolution of an OLED panel.

SUMMARY OF THE INVENTION

It is a primary object of the present invention to provide an OLED pixel structure and a method for manufacturing the OLED pixel structure using a novel pixel arrangement so as to improve the resolution of an OLED panel. The organic EL material for R, G, B or W is heated up and evaporated through an opening of a shadow mask onto a plurality of deposited regions on a substrate. The deposited regions with the evaporated organic EL material are categorized into a plurality of groups of sub-pixels with the same color, wherein each of the sub-pixels corresponds to different pixels. Therefore, the organic EL material evaporated through one single opening onto one deposited region can be used for multiple sub-pixels so as to effectively reduce the sub-pixel area and hence improve the resolution of an OLED panel.

It is a secondary object of the present invention to provide an OLED pixel structure and a method for manufacturing the OLED pixel structure using a novel pixel arrangement so as to improve the resolution of an OLED panel without significantly changing the current OLED manufacturing process. The present invention can be used in both bottom-emission and top-emission OLED's.

In order to achieve the foregoing objects, the present invention provides a method for manufacturing an organic light-emitting device (OLED) pixel structure, comprising steps of: providing a substrate; forming a plurality of thin-film transistors on the substrate; defining a plurality of deposited regions on the plurality of thin-film transistors; and evaporating an organic electro-luminescent (EL) material through an opening of a shadow mask onto at least two of the deposited regions, wherein each of the deposited regions with the evaporated organic electro-luminescent material is a sub-pixel corresponding to different pixels.

The present invention further provides a substrate; a plurality of thin-film transistors formed on the substrate; a plurality of deposited regions defined on the plurality of thin-film transistors; and an organic electro-luminescent (EL) layer formed on the deposited regions, wherein each of the deposited regions coated with the organic electro-luminescent material is a sub-pixel corresponding to different pixels.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE PREFERRED EMBODIMENT

The present invention providing an OLED pixel structure and a method for manufacturing the same can be exemplified by the preferred embodiments as described hereinafter.

Figure 1:
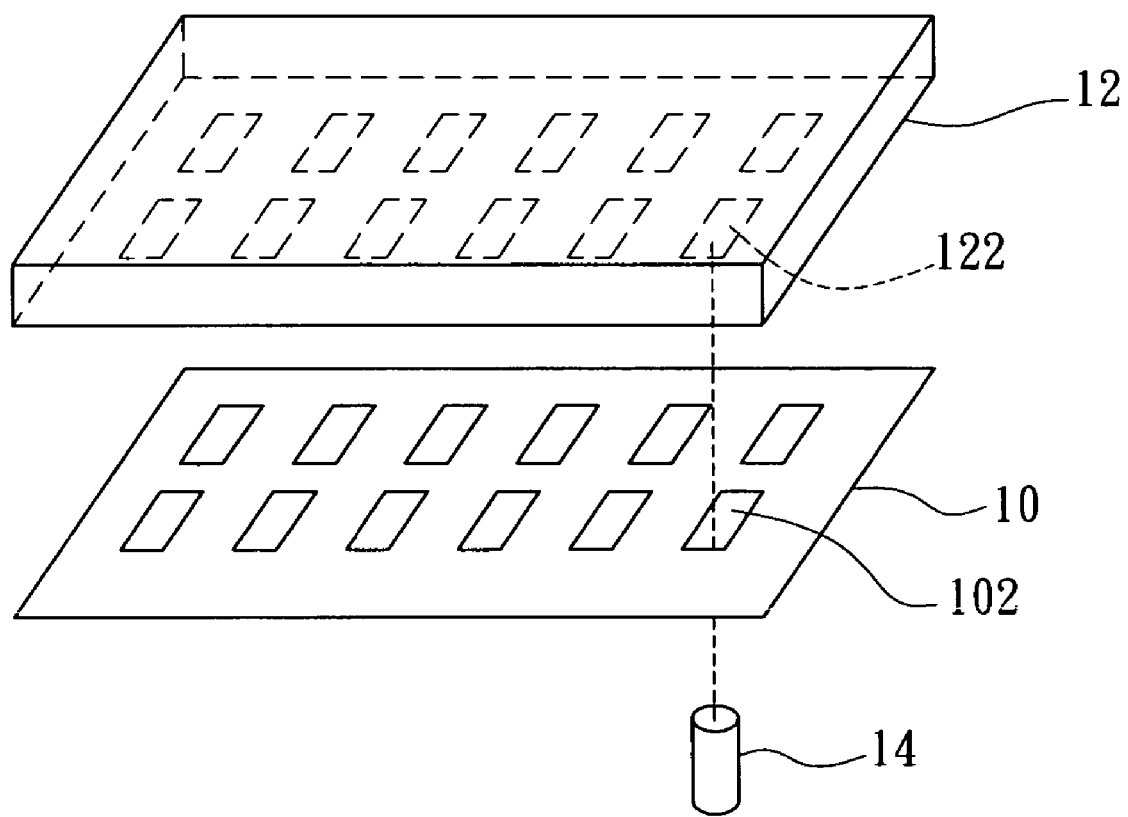
FIG. 1 is a schematic diagram showing an evaporation process for an organic EL material.
Figure 2:
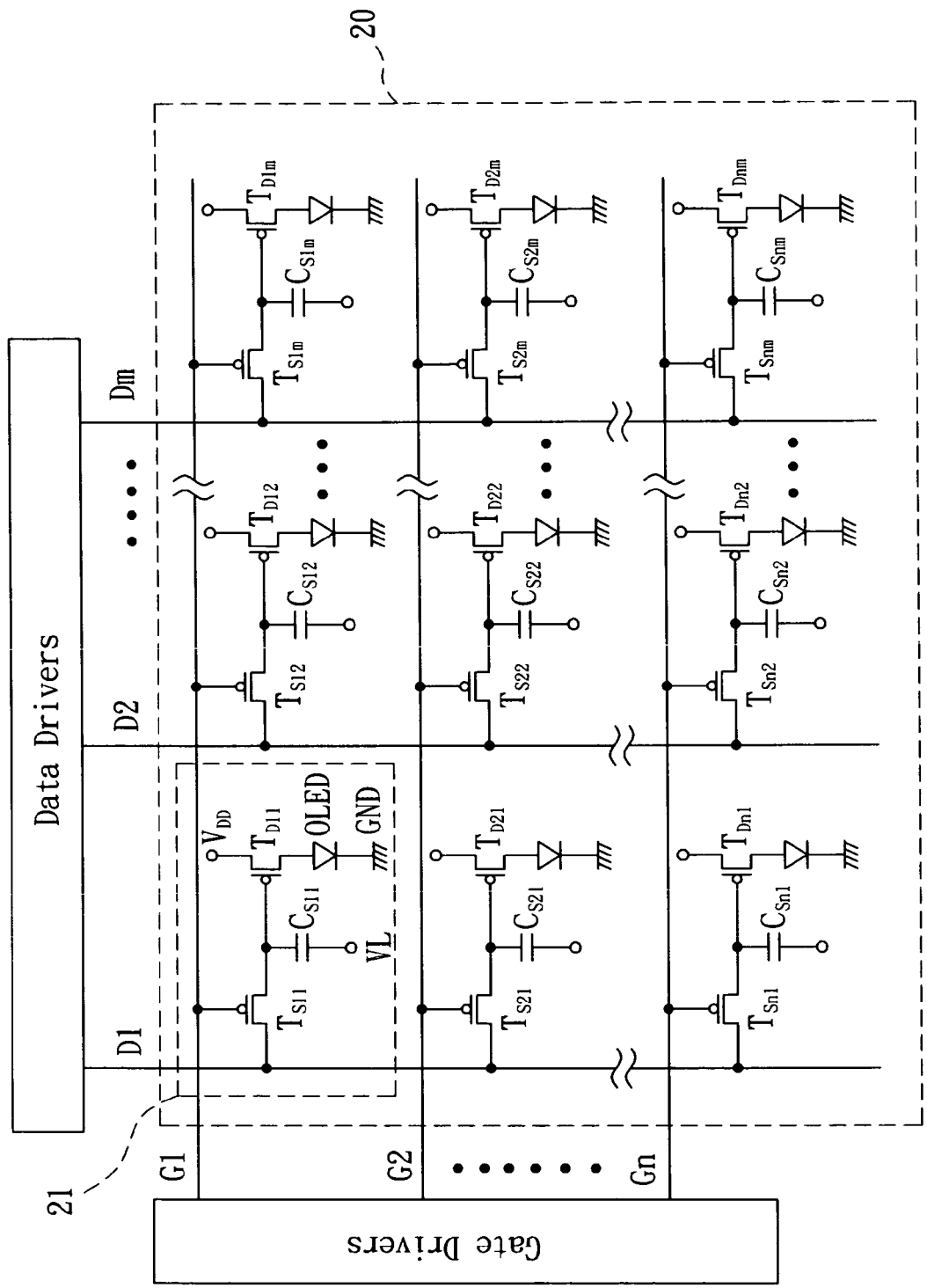
FIG. 2 is a schematic circuit diagram showing equivalent pixel circuits and driver circuits of an OLED panel.
Figure 3A:
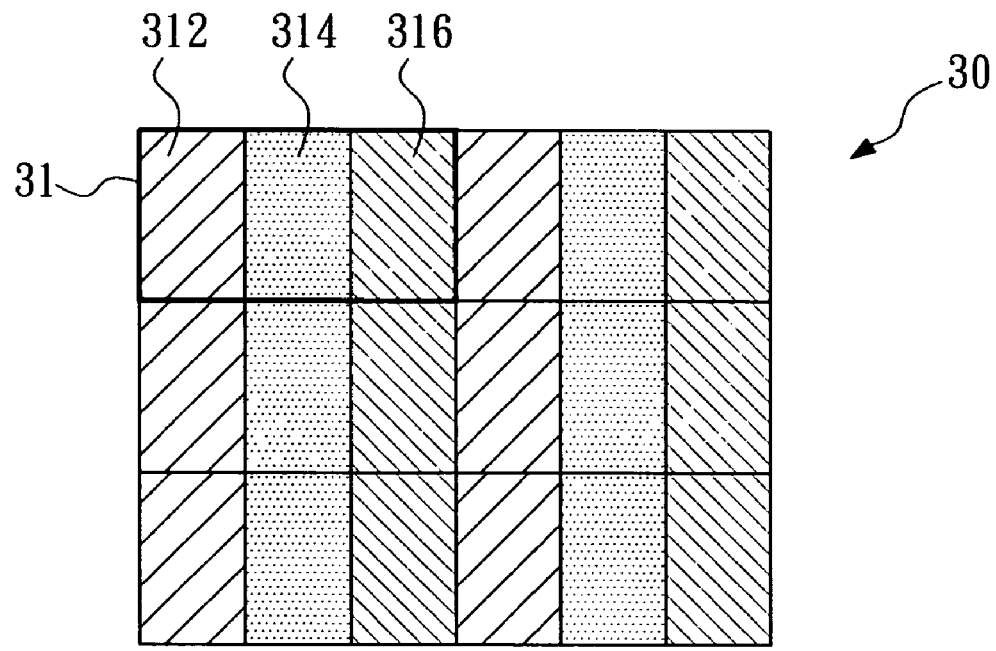
FIG. 3A and FIG. 3B are schematic diagrams showing pixel arrangements of an OLED panel.
Figure 3B:
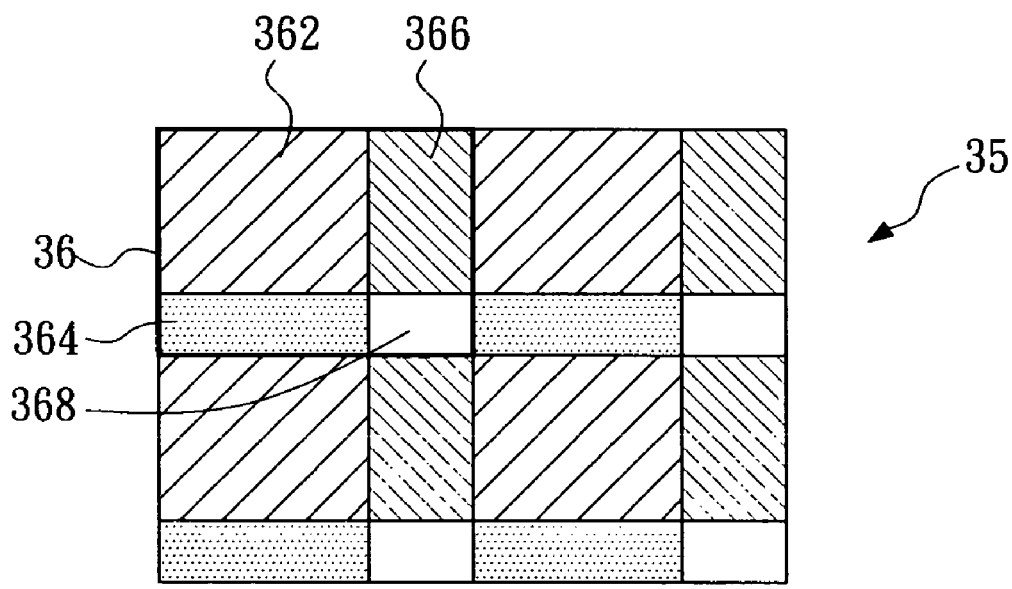
Figure 4A:
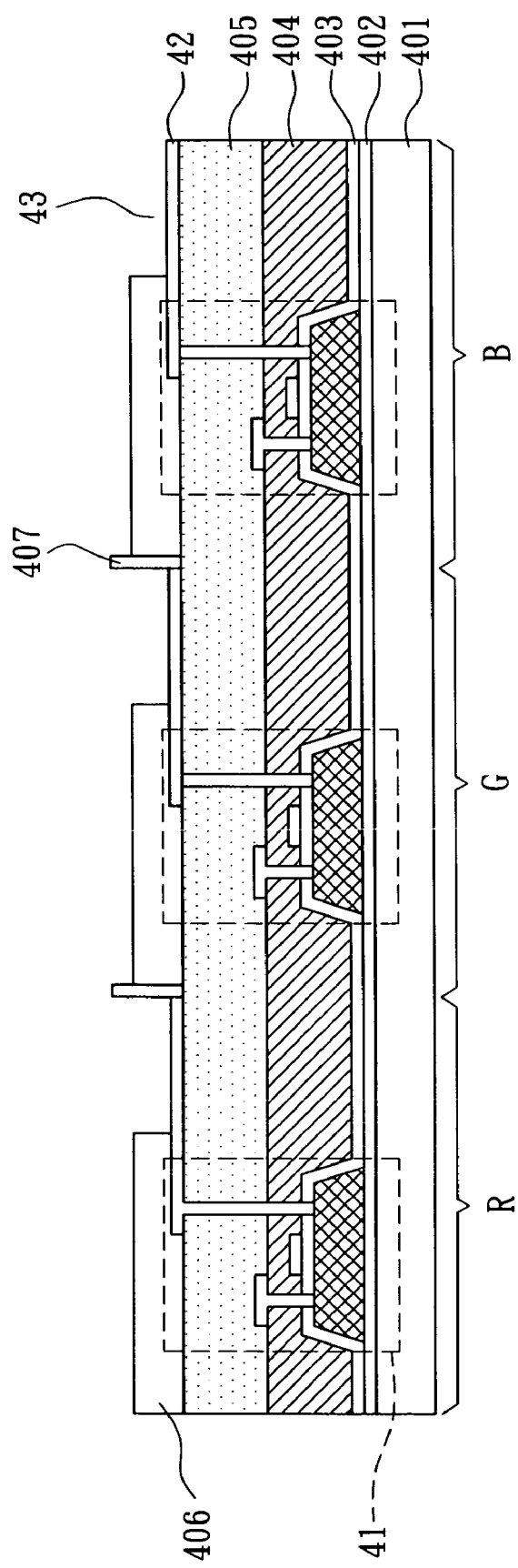
FIG. 4A to FIG. 4E are cross-sectional views showing an OLED pixel structure according to the present invention.
Figure 4B:
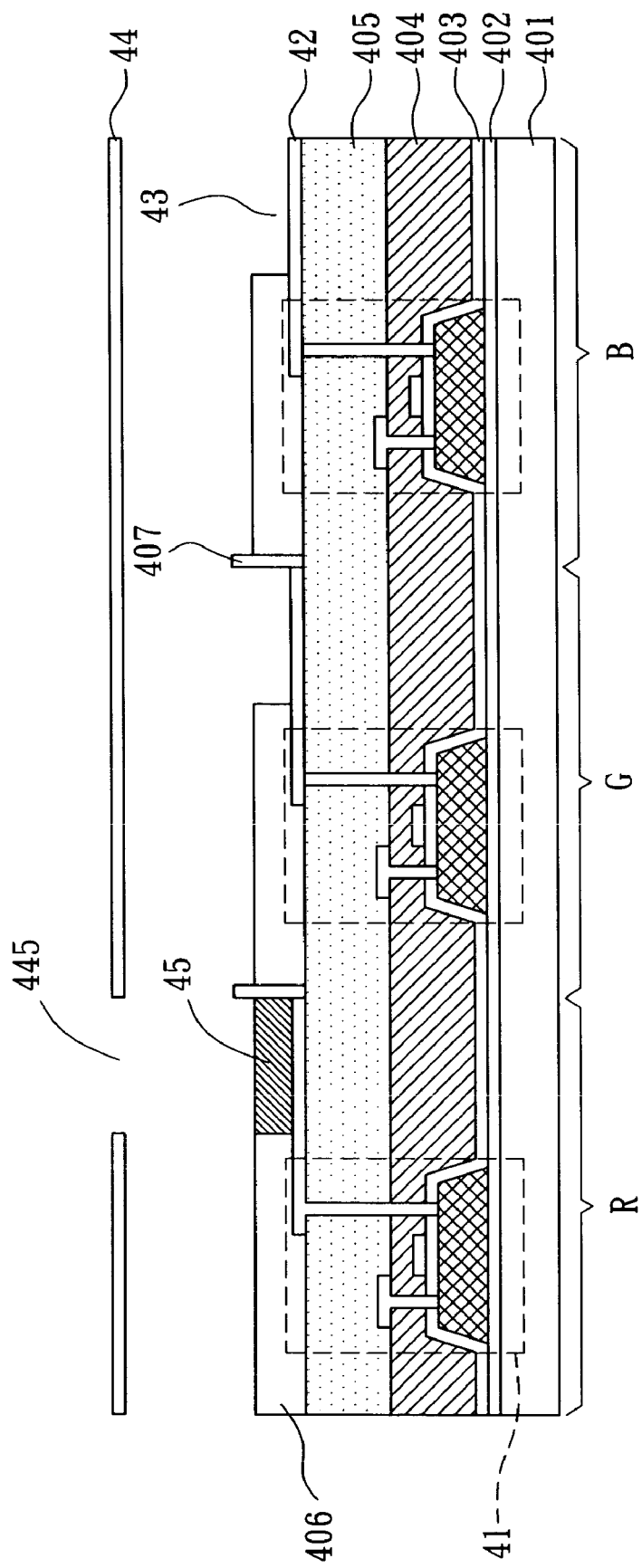
Figure 4C:
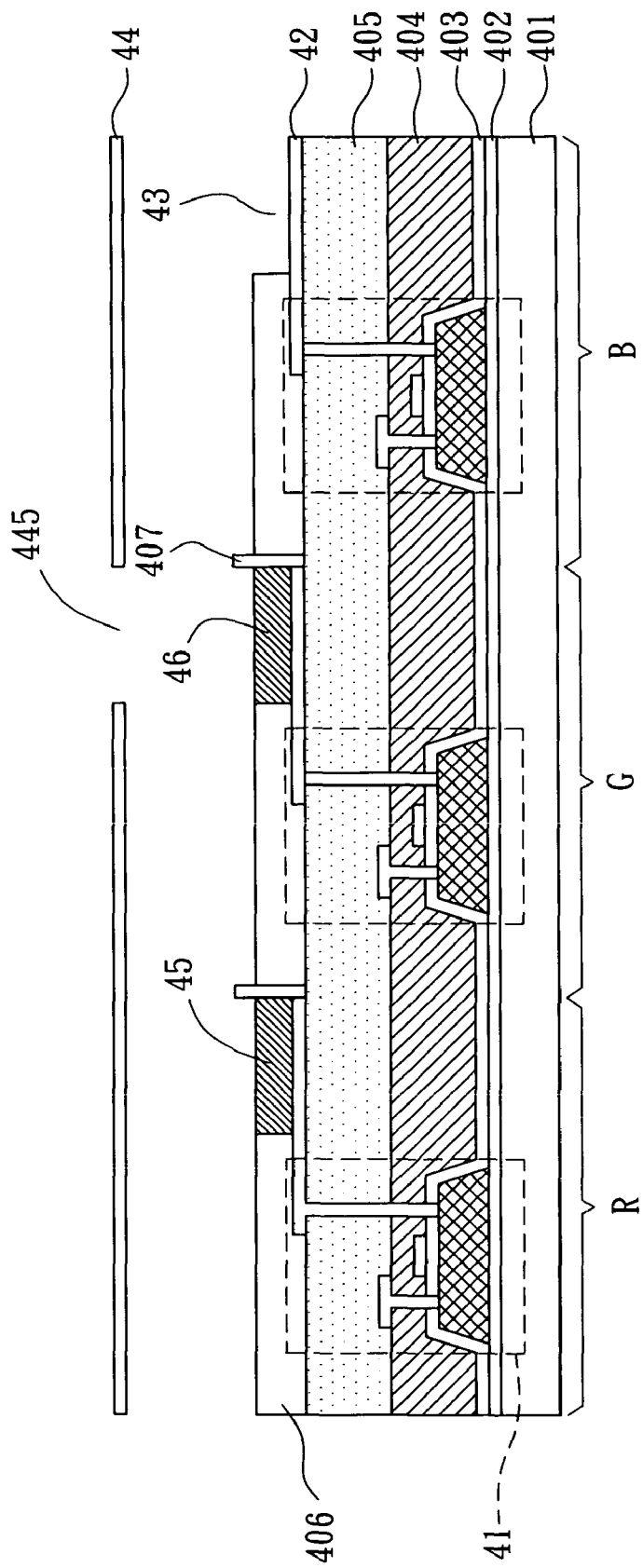
Figure 4D:
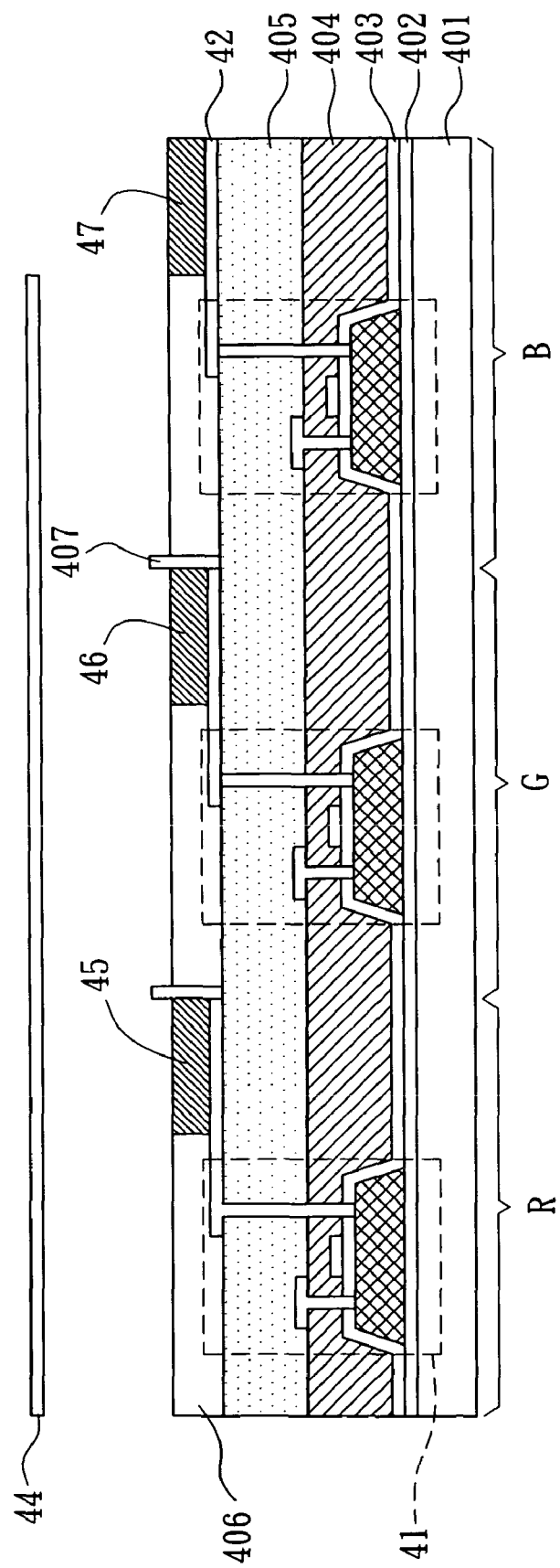
Figure 4E:
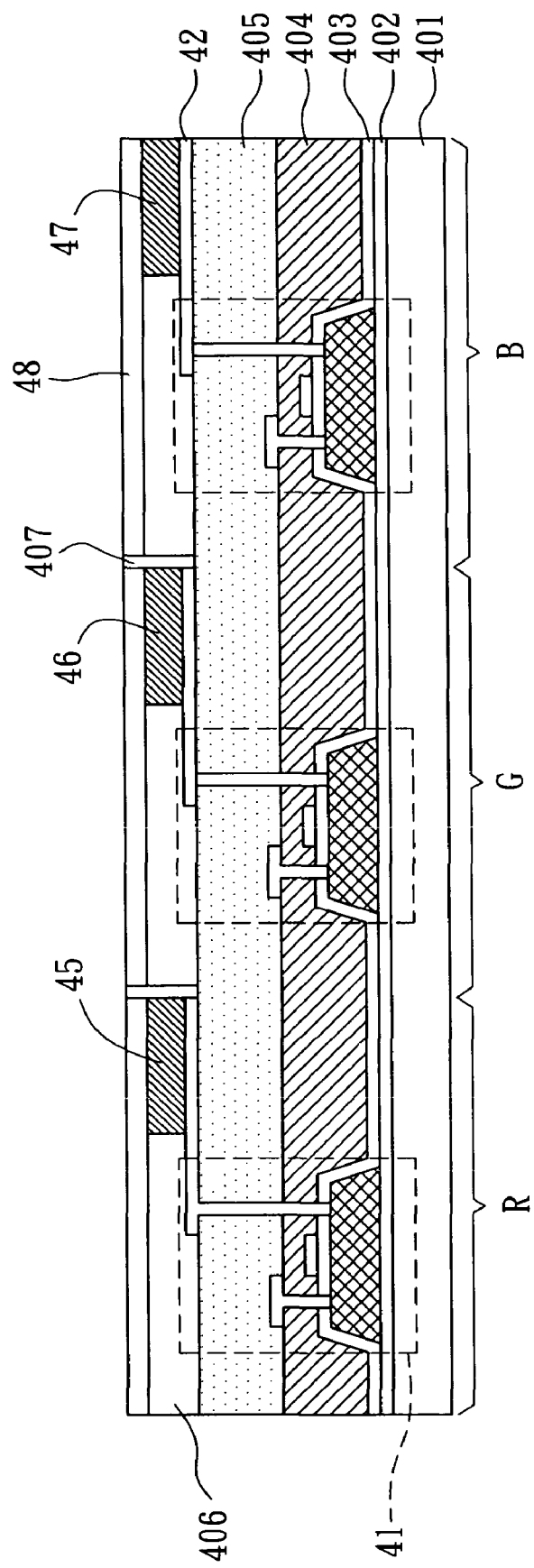

Please refer to FIG. 4A to FIG. 4E for the cross-sectional views showing an OLED pixel structure according to the present invention. In FIG. 4A, a substrate 401 is provided. On the substrate 401, in addition to thin-film transistors 41, there are formed a buffer layer 402, a gate dielectric layer 403, a first protective layer 404, an isolating layer 405 and a second protective layer 406. One of the source/drain regions of each of the thin-film transistors 41 is coupled to a pixel electrode (anode) 42. Deposited regions 43 are formed on the pixel electrode 42. Moreover, an insulating layer 407 is formed on the isolating layer 405 so as to distinguish the sub-pixels R, G, B. In FIG. 4B, an organic electro-luminescent (EL) material for red is evaporated through an opening 445 of a shadow mask 44 onto the deposited region 43 for a sub-pixel R. Therefore, an organic electro-luminescent layer 45 for red is formed. As shown in FIG. 4C, an organic electro-luminescent material for green is evaporated through the opening 445 of the shadow mask 44 onto the deposited region 43 for a sub-pixel G. Therefore, an organic electro-luminescent layer 46 for green is formed. As shown in FIG. 4D, an organic electro-luminescent material for blue is evaporated through the opening 445 of the shadow mask 44 onto the deposited region 43 for a sub-pixel B. Therefore, an organic electro-luminescent layer 46 for blue is formed. Finally in FIG. 4E, a pixel electrode (anode) 48 is formed on the organic electro-luminescent layers 45, 46, 47 so that a pixel structure is formed to comprise an R sub-pixel, a G sub-pixel and a B sub-pixel. Each sub-pixel comprises a thin-film transistor 41 as its driving transistor.

Figure 5A:
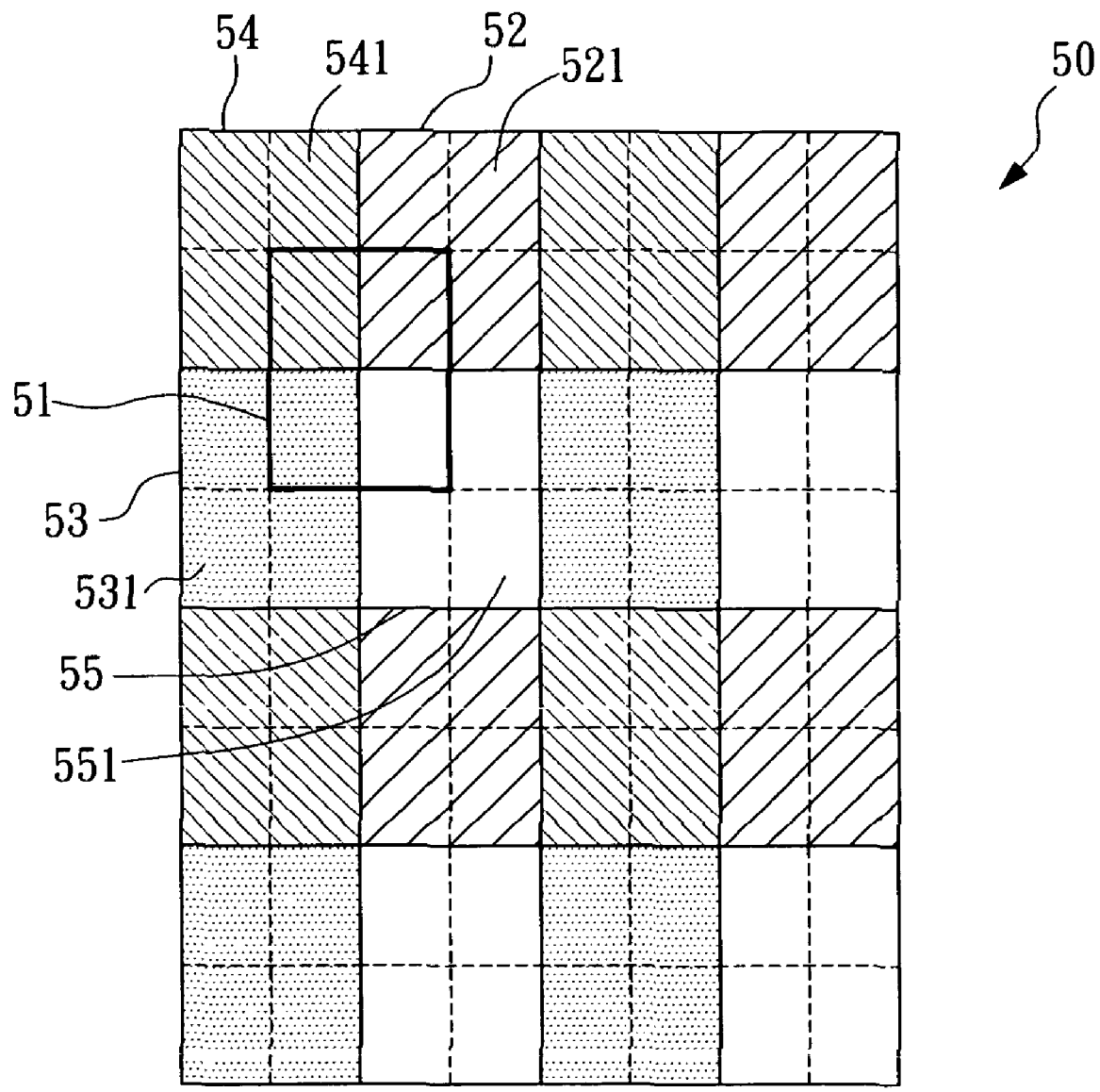
FIG. 5A is a schematic diagram showing a pixel arrangement of an OLED panel according to a first embodiment of the present invention.

Please refer to FIG. 5A, which is a schematic diagram showing a pixel arrangement of an OLED panel according to a first embodiment of the present invention. An OLED panel 50 comprises a plurality of pixels 51. Using evaporation, a rectangular region for red 52 comprising four red rectangular sub-pixels 521 is formed. Each of the red rectangular sub-pixels 521 corresponds to different pixels 51. Similarly, a rectangular region for green 53, a rectangular region for blue 54 and a rectangular region for white 55 are formed using evaporation. Each of four green rectangular sub-pixels 531 in the rectangular region for green 53 corresponds to different pixels 51. Each of four blue rectangular sub-pixels 541 in the rectangular region for blue 54 corresponds to different pixels 51. Each of four white rectangular sub-pixels 551 in the rectangular region for white 55 corresponds to different pixels 51. In other words, each pixel 51 is composed of a red rectangular sub-pixel 521, a green rectangular sub-pixel 531, a blue rectangular sub-pixel 541 and a white rectangular sub-pixel 551. In the prior art, the opening has a certain area, which limits the sub-pixel area. However, with the pixel arrangement of the present invention, multiple sub-pixels of the same color can be formed in one evaporation process for different pixels. Therefore, the sub-pixel for one pixel is down-sized and thus the resolution of an OLED panel can be effectively improved.

Figure 5B:
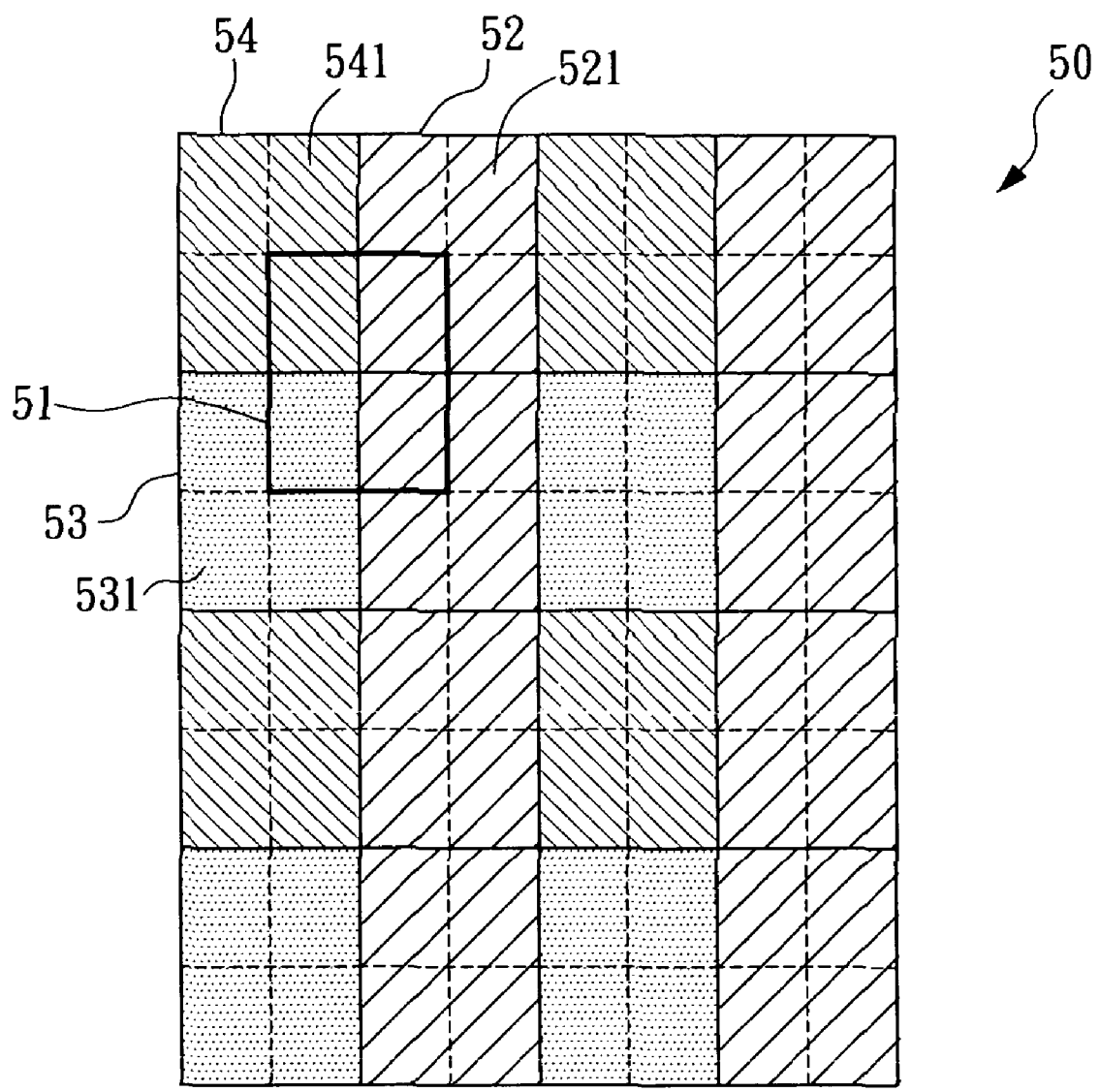
FIG. 5B is a schematic diagram showing a pixel arrangement of an OLED panel according to a second embodiment of the present invention.

Please refer to FIG. 5B, which is a schematic diagram showing a pixel arrangement of an OLED panel according to a second embodiment of the present invention. Since the durability of an OLED panel depends on the sub-pixel with the shortest life-time, the sub-pixel with the shortest life-time can be designed to have the largest area without changing the evaporation process so as to improve the durability of the OLED panel according to the present invention. For example, the rectangular region for white 55 in FIG. 5A can be used to deposit the organic EL material for red so that all the rectangular regions for white 55 in FIG. 5A are replaced by the rectangular regions for red 52. Accordingly, the organic EL material for red occupies twice the area and thus the red sub-pixels share a larger luminescent area. Under the same luminescent intensity, the driving current for the red sub-pixels can be lowered so as to improve the durability of the OLED panel.

Figure 6:
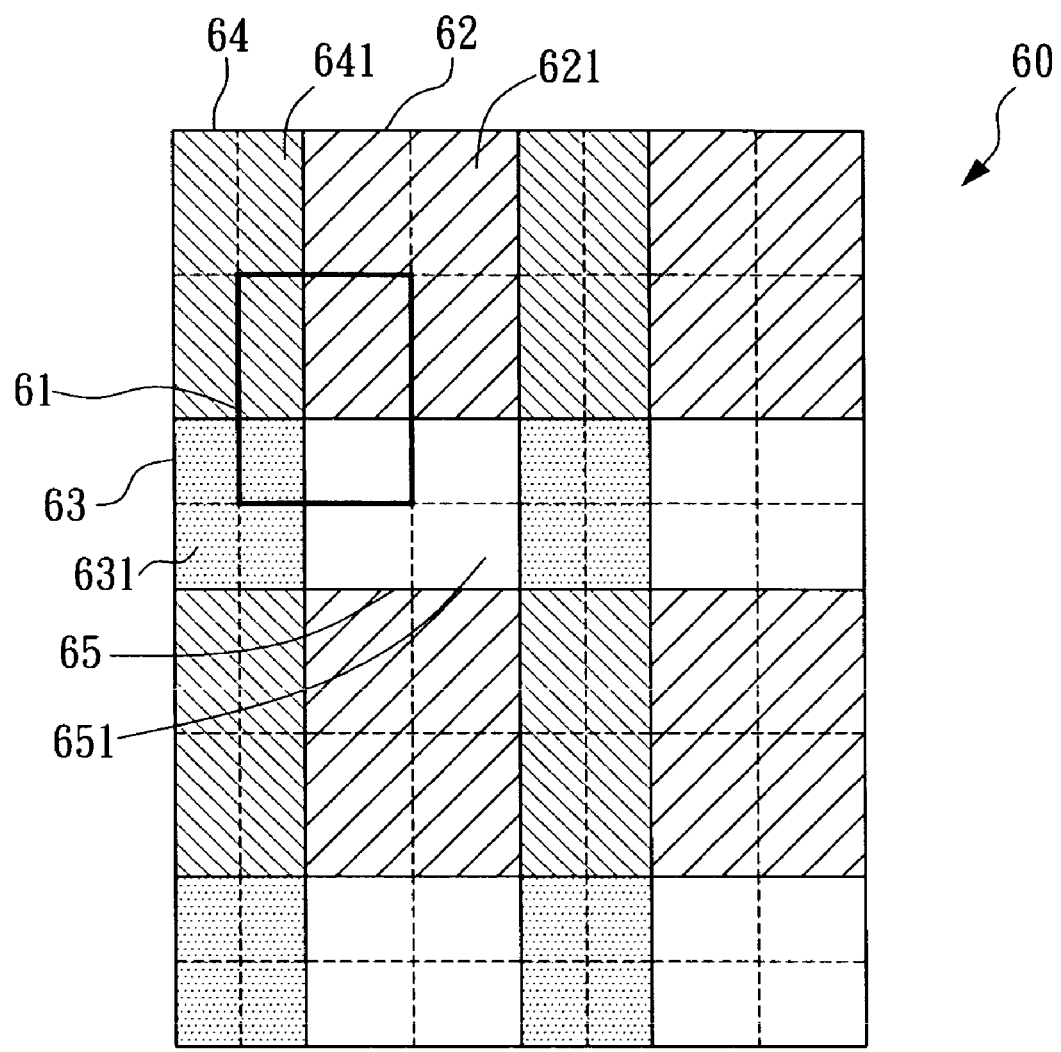
FIG. 6 is a schematic diagram showing a pixel arrangement of an OLED panel according to a third embodiment of the present invention.

Please refer to FIG. 6, which is a schematic diagram showing a pixel arrangement of an OLED panel according to a third embodiment of the present invention. An OLED panel 60 comprises a plurality of pixels 61. In the first embodiment as shown in FIG. 5A, the rectangular region for red 52, the rectangular region for green 53, the rectangular region for blue 54 and the rectangular region for white 55 are formed by evaporating organic EL materials through the opening with the identically small area for all the sub-pixels. Therefore, a highest resolution is obtained using the identically small area for the red rectangular sub-pixels 521, the green rectangular sub-pixels 531, the blue rectangular sub-pixels 541 and the white rectangular sub-pixels 551 because the opening area of the shadow mask can not be unlimitedly down-sized. However in the third embodiment as shown in FIG. 6, the areas for the red rectangular sub-pixels 621, the green rectangular sub-pixels 631, the blue rectangular sub-pixels 641 and the white rectangular sub-pixels 651 can be different according to practical use. Different opening areas can be selected when evaporating the organic EL materials onto the rectangular regions for red 62, the rectangular regions for green 63, the rectangular regions for blue 64 and the rectangular regions for white 65. For example, the rectangular regions for red 62 require the largest area and therefore a shadow mask with a largest opening area is selected when evaporating the EL material onto the rectangular regions for red 62. On the contrary, the rectangular regions for green 63 require the smallest area and therefore a shadow mask with a smallest opening area is selected when evaporating the EL material onto the rectangular regions for green 63. After the rectangular regions for red 62, the rectangular regions for green 63, the rectangular regions for blue 64 and the rectangular regions for white 65 are formed using evaporation, each of the pixels 61 comprises a red rectangular sub-pixel 621, a green rectangular sub-pixel 631, a blue rectangular sub-pixel 641 and a white rectangular sub-pixel 651. Each sub-pixel area is different. Even though the resolution of the OLED panel 60 in FIG. 6 is superior to the resolution of the OLED panel 50 in FIG. 5A, the resolution of the OLED panel 60 is still higher than the resolution of conventionally manufactured OLED panel. The third embodiment of the present invention provides OLED panel designers with greater flexibility since the areas of sub-pixels for different colors are not identical.

It is to be noted that the cross-sectional views in FIG. 4A to FIG. 4E are only exemplary. The present invention can be used in both bottom-emitting and top-emitting pixel structures. The substrate used in the present invention can be a flexible substrate, a glass substrate or a metal substrate. The transistors of the present invention are not limited to a certain type of transistors. The transistors of the present invention can be implemented using a bottom gate or a top gate, amorphous silicon, poly-silicon or an organic material so as to be adapted in the OLED pixel structure and the method for manufacturing the same.

According to the above discussion, it is apparent that the present invention discloses an OLED pixel structure and a method for manufacturing the OLED pixel structure using a novel pixel arrangement so as to improve the resolution of an OLED panel without significantly changing the current OLED manufacturing process. Therefore, the present invention is novel, useful and non-obvious.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for manufacturing an organic light-emitting device (OLED) pixel structure, comprising steps of:
   providing a substrate;
   forming a plurality of thin-film transistors on the substrate;
   defining a plurality of deposited regions on the plurality of thin-film transistors; and
   evaporating an organic electro-luminescent (EL) material through an opening of a shadow mask onto at least two of the deposited regions,
   wherein each of the deposited regions with the evaporated organic electro-luminescent material is equally divided into a plurality of sub-pixels, each sub-pixel respectively corresponding to a pixel, an arrangement of the sub-pixels in two immediately adjacent pixels being different, wherein the colors of any two immediately adjacent sub-pixels that respectively correspond to any two immediately adjacent pixels are the same.

2. The method for manufacturing an OLED pixel structure as recited in claim 1, wherein the organic electro-luminescent material is one of an organic electro-luminescent material for red, an organic electro-luminescent material for green, an organic electro-luminescent material for blue and an organic electro-luminescent material for white.

3. The method for manufacturing an OLED pixel structure as recited in claim 1, wherein the deposited regions with the evaporated organic electro-luminescent material are adjacent to one another.

4. The method for manufacturing an OLED pixel structure as recited in claim 1, wherein the pixel comprises a red sub-pixel, a green sub-pixel and a blue sub-pixel.

5. The method for manufacturing an OLED pixel structure as recited in claim 1, wherein the pixel comprises a red sub-pixel, a green sub-pixel, a blue sub-pixel and a white sub-pixel.

6. The method for manufacturing an OLED pixel structure as recited in claim 1, wherein the deposited regions and the sub-pixels are rectangular.

\* \* \* \* \*